US008045727B2

(12) United States Patent
Philipp

(10) Patent No.: US 8,045,727 B2
(45) Date of Patent: Oct. 25, 2011

(54) HEADSET POWER MANAGEMENT

(75) Inventor: Harald Philipp, Hamble (GB)

(73) Assignee: Atmel Corporation, San Jose, CA (US)

( * ) Notice: Subject to any disclaimer, the term of this patent is extended or adjusted under 35 U.S.C. 154(b) by 1032 days.

(21) Appl. No.: 11/333,489

(22) Filed: Jan. 17, 2006

(65) Prior Publication Data

US 2007/0121959 A1 May 31, 2007

Related U.S. Application Data

(60) Provisional application No. 60/722,476, filed on Sep. 30, 2005.

(51) Int. Cl.
*H03B 29/00* (2006.01)
*H04R 25/00* (2006.01)

(52) U.S. Cl. .......................... 381/74; 381/71.9; 381/370

(58) Field of Classification Search ............. 379/428.02, 379/433.01; 455/575.2; 381/370, 376, 74, 381/72, 309; 324/678; 725/9; 701/45; 607/136, 607/55

See application file for complete search history.

(56) References Cited

U.S. PATENT DOCUMENTS

| | | | | |
|---|---|---|---|---|
| 4,005,278 | A | 1/1977 | Gorike | |
| 4,806,846 | A * | 2/1989 | Kerber | 324/678 |
| 5,224,151 | A | 6/1993 | Bowen et al. | |
| 5,337,353 | A | 8/1994 | Boie et al. | |
| 5,678,202 | A | 10/1997 | Filimon et al. | |
| 5,712,911 | A | 1/1998 | Her | |
| 5,730,165 | A * | 3/1998 | Philipp | 137/1 |
| 6,356,644 | B1 | 3/2002 | Pollak | |
| 6,466,036 | B1 * | 10/2002 | Philipp | 324/678 |
| 6,532,447 | B1 | 3/2003 | Christensson | |
| 7,010,332 | B1 * | 3/2006 | Irvin et al. | 455/575.2 |
| 7,142,666 | B1 * | 11/2006 | Bates et al. | 379/421 |
| 7,400,914 | B2 | 7/2008 | Schwald | |

(Continued)

FOREIGN PATENT DOCUMENTS

DE 195 42 930 A1 8/1996

(Continued)

OTHER PUBLICATIONS

English language abstract of DE 195 42 930 (Aug. 22, 1996).

(Continued)

*Primary Examiner* — Davetta Goins
*Assistant Examiner* — Phylesha Dabney
(74) *Attorney, Agent, or Firm* — Baker Botts L.L.P.

(57) ABSTRACT

The invention relates to an energy saving headset 100. The headset 100 comprises a power management unit 150 that is operable to reduce the power consumption of the headset 100 when a user 110 is not present. The power management unit 150 uses capacitive sensing to detect the presence of the user 110. Capacitive sensing is advantageous since it provides a flexible and reliable sensor that can accurately detect the presence or absence of a user 110 either by detecting user proximity or user contact. Moreover, in various embodiments, the sensitivity of a capacitive sensor may be adjusted to account for user movement or changes in environmental conditions, such as, for example, the presence of water, or sweat, on the headset 100 to further improve sensing reliability. The invention further relates to headsets using user presence signals based on capacitive sensing to control other functions of the headset or to control external devices to which the headset is connected, either wirelessly or by wires.

22 Claims, 8 Drawing Sheets

U.S. PATENT DOCUMENTS

| | | | | |
|---|---|---|---|---|
| 2001/0044318 | A1 | 11/2001 | Mantyjarvi et al. | |
| 2002/0068537 | A1 | 6/2002 | Shim et al. | |
| 2004/0204190 | A1 | 10/2004 | Dietrich et al. | |
| 2004/0228494 | A1* | 11/2004 | Smith | 381/67 |
| 2005/0052429 | A1 | 3/2005 | Philipp | |
| 2007/0046299 | A1 | 3/2007 | Hargreaves et al. | |
| 2008/0317105 | A1 | 12/2008 | Cohen et al. | |

FOREIGN PATENT DOCUMENTS

| | | | |
|---|---|---|---|
| DE | 693 10981 | T2 | 5/1997 |
| EP | 0564164 | A1 | 6/1993 |
| EP | 1260082 | A1 | 8/2001 |
| GB | 1483829 | A | 8/1977 |
| GB | 2357400 | A | 6/2001 |
| JP | 77193899 | | 7/1995 |
| JP | 2000147135 | | 5/2000 |
| JP | 2000278785 | A | 10/2000 |
| JP | 2002009918 | | 1/2002 |
| JP | 2002039708 | | 2/2002 |
| JP | 2003524341 | | 8/2003 |
| WO | WO-01063888 | A1 | 8/2001 |
| WO | 03/103175 | A1 | 12/2003 |
| WO | 2005/099105 | A1 | 10/2005 |

OTHER PUBLICATIONS

GB Patent Office, Search and Examination Report in GB0618960.9.

"U.S. Appl. No. 11/536,583, Non-Final Office Action mailed Apr. 29, 2009", 25 pgs.

"U.S. Appl. No. 11/536,583, Response filed Oct. 29, 2009 to Non Final Office Action mailed Apr. 29, 2009", 10 pgs.

"U.S. Appl. No. 11/536,583, Non-Final Office Action mailed Jul. 26, 2010", 18 pgs.

"U.S. Appl. No. 11/536,583, Final Office Action mailed Feb. 23, 2010", 25 pgs.

"U.S. Appl. No. 11/536,583, Preliminary Amendment filed Jan. 28, 2008", 4 pgs.

"U.S. Appl. No. 11/536,583, Response filed May 11, 2010 to Final Office Action mailed Feb. 23, 2010", 9 pgs.

"Japanese Application Serial No.2006-269534, Office Action mailed on Jul. 1, 2010", 2.

"U.S. Appl. No. 11/536,583, Response Filed Sep. 2, 2010 to Non Final Office Action mailed Jul. 26, 2010", 9 pgs.

"U.S. Appl. No. 11/536,583, Final Office Action mailed Nov. 12, 2010", 18 pgs.

* cited by examiner

LOOP

| STEP | S1 | S2 | S3 | FUNCTION |
|---|---|---|---|---|
| A | - | X | X | RESET ALL |
| B | - | - | - | DEADTIME |
| C | X | - | - | CHARGE-TRANSFER |
| D | - | - | - | DEADTIME |
| E | - | X | - | HOLD |
| F | - | X | - | MEASURE |

HEADSET POWER MANAGEMENT

FIELD

The invention relates to apparatus comprising headsets and more especially but not exclusively to power management and/or function control of such apparatus. In particular, the invention relates to power management in a headset that comprises one or more circuit elements that consume electrical power such as, for example, a Bluetooth™ or other wireless receiver.

BACKGROUND

Many different types of headsets have been designed by numerous manufacturers with various types of end user application in mind. For example, stereo headphones for listening to music have been around for many years, as have ear pieces for use with hearing aids, portable radios such as GB 1,483,829A, U.S. Pat. No. 5,678,202 and U.S. Pat. No. 6,356,644.

Recently, many new types of headset that can be worn by a user have been developed with a view to using them with mobile cellular telephones or other portable electronic devices. Numerous headset designs have been created to enable a user to use such a portable electronic device without the need to hold the electronic device: the so-called "hands-free" mode of operation.

Many of the recently developed headsets are cordless devices that incorporate a Bluetooth™ receiver or a Bluetooth™ receiver/transmitter. Bluetooth™ is a radio-frequency communications standard developed by a group of electronics manufacturers that allows various types of electronic equipment to interconnect, without the need for wires, cables or detailed user intervention. The Bluetooth™ standard enables various electronic devices to inter-operate, since all electronic products that use Bluetooth™ have to use an agreed standard that dictates when data bits are sent, how many data bits are sent at any one time, how data transmission errors are handled, etc.

Whilst improved design has lead to improvements in the size and weight of headsets, the functionality of headsets has increased dramatically. This has increased pressure on engineers to consider how most efficiently to use the electrical power available, particularly for cordless battery-operated headsets where battery life and available power are limited.

With a view to improving power usage, various manufacturers have developed headsets that incorporate power management features.

One prior art design is that of the Sony™ MDR-DS8000 headset available from Sony™ Corporation. In this headset, an electromechanical switch is provided that changes state when the ear pieces are pulled apart when the headset is being put on by a user. This is done by the headband expanding and pulling on a switch mechanism.

In another prior art design JP2000278785 A, an inductive noise signal is provided by a metallic ring built into an ear piece when the ear piece contact a user. This signal is used to detect the presence or absence of a user to determine whether or not to power-down a signal amplifier.

While these known power-saving headsets fulfil the desired function, they are not without various drawbacks. For example, mechanical switches are relatively bulky and expensive, and they can also suffer from long-term reliability problems. Moreover, the mechanical headband switch approach is not transferable to non-headband based headsets such as single-ear devices, for example ones that operate wirelessly by Bluetooth™ or otherwise. Sensing user presence based upon detecting inductive noise is also less than ideal, particularly given the random nature of such noise and its amplitude variability according to differing physical conditions, such as the degree of electrode contact with the user (e.g. if a user is jogging), prevailing environmental conditions (e.g. if a user is sweating or is exposed to rain), etc.

SUMMARY OF THE INVENTION

According to a first aspect of the invention, there is provided an apparatus comprising: a headset including a sensing element; a capacitance measurement circuit operable to measure the capacitance of the sensing element; and a control circuit operable to determine whether a user is wearing the headset based on a measurement of the capacitance of the sensing element, and to control a function of the apparatus according to whether the headset is being worn.

Thus a simple and reliable way of controlling functions of an apparatus in dependence on whether or not a headset is being worn is provided. Various functions can be controlled. For example, the controlled function may be a power saving function. Alternatively, the function may relate to activation of an audio amplifier, activation of a wireless communications transceiver, outputting of an audio signal by an audio generator, and/or the inhibition of user input signals, for example.

Any form of capacitance measurement circuitry may be employed, for example circuitry based on RC circuits, relaxation oscillators, phase shift measurements, phase locked loop circuitry, capacitive divider circuitry may be used. Capacitance measurement based on charge transfer techniques in particular are well suited to this application. Thus the capacitance measurement circuit may include a sample capacitor and be operable to transfer charge from the sensing element to the sample capacitor to generate an electric potential at the sample capacitor for measuring. Furthermore, the capacitance measurement circuit may comprise a switch operable to transfer a burst of charge packets sequentially from the sensing element to the sample capacitor prior to a measurement of the electric potential being made.

The control circuit may be operable to determine whether a user is wearing the headset by comparing a measured capacitance of the sensing element to one or more predetermined threshold values. The measured capacitance may be an absolute value of capacitance or a differential measurement of capacitance, e.g. a difference from an earlier measured value.

The capacitance measurement circuit may be external to the headset, e.g. in a base unit, or may be internal to the headset. Furthermore, the control circuit and/or a circuit element providing the function to be controlled may be external to the headset, e.g. in a base unit, or may be internal to the headset.

According to a second aspect of the invention, there is provided a method of operating an apparatus comprising a headset, the method comprising: measuring the capacitance of a sensing element in the headset; determining from the measured capacitance whether a user is wearing the headset; and controlling a function of the apparatus in response to determining whether the headset is being worn.

The measuring the capacitance of the sensing element may include: transferring charge from the sensing element to a sample capacitor; measuring the electric potential at the sample capacitor; and determining the capacitance of the sensing element from the measured electric potential of the sample capacitor. Furthermore, the transferring charge from the sensing element to a sample capacitor may comprise transferring a burst of charge packets in sequence from the sensing element to a sample capacitor.

The determining whether a user is wearing the headset or not may comprise comparing the measured capacitance of the sensing element to one or more predetermined threshold values in order to determine whether the capacitance of the sensing element has been changed due to the proximity of a user. Furthermore, the method may include adjusting one or more of the threshold values in response to changes in operating conditions.

According to a third aspect of the invention, there is provided an energy saving headset comprising a power management unit operable to reduce the power consumption of the headset when it is not being worn by a user. The power management unit includes a sensing circuit coupled to a capacitive sensor. The sensing circuit is operable to measure the capacitance of the capacitive sensor and to generate a user presence signal in dependence upon the measured capacitance. The user presence signal is indicative of whether a user is present or not. The power management unit is operable in accordance with the user presence signal to control one or more circuit elements that are provided in the headset, typically a power control.

Power control will normally be by switching the circuit element on or off. However, the power control need not be a simple binary function, but may include reducing the power to a stand by level for example, or reducing the power supplied to a power amplifier so that it is still operable but at reduced gain, e.g. to suppress feedback that may otherwise occur. However, it will be understood that the user presence signal can be used, by the power management unit or otherwise, to control other functions not directly related to power. For example, the user presence signal can be used to control other functions of the headset, or to output an external output signal that can be received by other devices to which the headset is connected, either wirelessly or wired. For example, removal of the headset may be used to pause playing activity of a sound or video track, whereafter putting the headset back on will cause resumption of playing responsive once more to the user presence signal. Another example would be when placing the headset on by the user causes playback to be switched from an external loudspeaker to the headset speaker.

Accordingly the invention further relates to a headset with reduced power consumption, comprising: at least one circuit element requiring power; a capacitive sensor operable to provide a capacitance measurement signal; and a power management unit including a sensing circuit operable to generate a user presence signal responsive to the capacitance measurement signal indicating whether the headset is being worn and operable to control the at least one circuit element dependent on said user presence signal. The at least one circuit element may control a function of the headset, such as its power delivery. Alternatively, the at least one circuit element may be used indirectly to control the function of an external device by transmitting the user presence signal externally.

According to a second aspect of the invention, there is provided a method of operating a headset in order to reduce power consumption. The method comprises measuring the capacitance of a capacitive sensor, determining from the measured capacitance whether a user is present or not, and powering-down one or more circuit elements in the headset in response to determining that no user is present in order to reduce the power consumption of the headset.

As mentioned above, the user preference detection may be used to control functions other than power consumption. Consequently, the invention also relates to a method of operating a headset, the method comprising: measuring the capacitance of a capacitive sensor; determining from the measured capacitance whether a user is present or not; and controlling a function of the headset, or outputting an external output signal that can be received by another device to which the headset is connected, in response to determining whether the user is present or not. The external device to which the headset is connected may be connected wirelessly or by wires.

The claimed capacitive sensing solution provides a simple, inexpensive and reliable sensor which is superior to the prior art mechanical solution described above.

The capacitive sensor can operate either on proximity or direct contact depending on how its sensitivity is calibrated. The sensitivity of the capacitive sensor may also be dynamically adjusted to account for changes in environmental conditions, such as, for example, humidity.

According to a further aspect of the invention there is provided a headset with reduced power consumption, comprising: at least one circuit element requiring power; a capacitive sensor operable to provide a capacitance measurement signal; and a power management unit including a sensing circuit operable to generate a user presence signal responsive to the capacitance measurement signal indicating whether the headset is being worn and operable to control the at least one circuit element dependent on said user presence signal.

The sensing circuit may include a sample capacitor and be further operable to transfer charge from the capacitive sensor to the sample capacitor to generate an electric potential at the sample capacitor for measuring.

The headset may further comprise at least one switch operable to transfer a burst of charge packets sequentially from the capacitive sensor to the sample capacitor prior to any measurement of the electric potential being made.

The sensing circuit may comprise a consensus filter for generating the user presence signal.

The sensing circuit may further be operable automatically to perform a self-calibration operation.

The capacitive sensor may comprise an electrode that is electrically isolated from the user when the headset is being worn.

At least one of the circuit elements may comprise a Bluetooth™ receiver.

According to a still further aspect of the invention there is provided a method of operating a headset in order to reduce power consumption, the method comprising: measuring the capacitance of a capacitive sensor; determining from the measured capacitance whether a user is present or not; and powering down one or more circuit elements in the headset in response to determining that no user is present in order to reduce the power consumption of the headset.

The measuring the capacitance of the capacitive sensor may include: transferring charge from the capacitive sensor to a sample capacitor; measuring the electric potential at the sample capacitor; and determining the capacitance of the capacitive sensor from the measured electric potential of the sample capacitor.

The transferring charge from the capacitive sensor to a sample capacitor may comprise transferring a burst of charge packets in sequence from the capacitive sensor to a sample capacitor.

The determining whether a user is present or not may comprise comparing the measured capacitance of the capacitive sensor to one or more predetermined threshold values in order to determine whether the capacitance of the capacitive sensor has been changed by the proximity of the user.

The method may comprise adjusting one or more of the threshold values in response to changes in operating conditions.

BRIEF DESCRIPTION OF THE DRAWINGS

For a better understanding of the invention and to show how the same may be carried into effect, reference is now made to the accompanying drawings in which.

DETAILED DESCRIPTION

Figure 1:
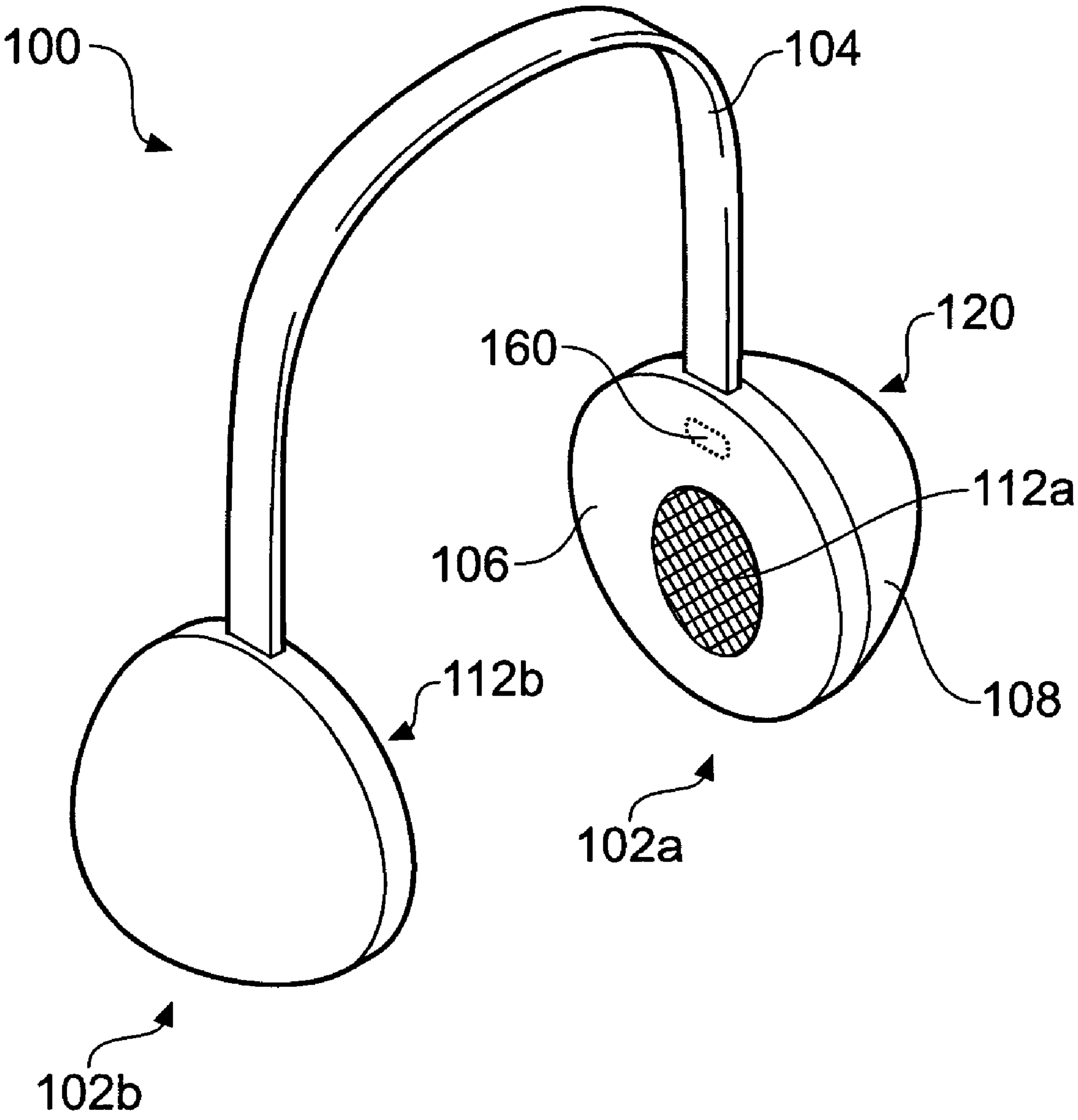
FIG. 1 shows a schematic diagram of an energy saving headset according to an embodiment of the present invention.

FIG. 1 shows a schematic diagram of an energy saving headset 100. The headset 100 comprises first and second casings 102*a* and 102*b* housing respective loudspeakers 112*a* and 112*b* for reproducing stereo sound. The casings 102*a* and 102*b* are physically connected together by a headband 104 that comprises a recess for housing electrical cabling (not shown) which connects the loudspeaker 112*b* in the second casing 102*b* to headset electronics 120 housed in the first casing 102*a*.

The casings 102*a* and 102*b* are formed of an outer casing cover 108 and an inner cover 106 that contacts a user's ear when the headset 100 is being worn. The casing cover 108 may be used to mount various user operable controls (not shown), such as, for example, volume controls, channel controls etc. The cover 106 can be provided over padding for user comfort and be made from various materials, including, for example, a flexible water-resistant polymeric sheet material. An opening in the cover 106 exposes the loudspeaker 112 to the user's respective ear when the headset 100 is being worn.

The headset electronics 120 provides a power management function in order to lessen power consumption when no user is wearing the headset 100. The headset electronics 120 uses capacitive sensing in order to detect whether or not a user is wearing the headset 100. In addition to power management, the headset electronics 120 may also provide various other functions, such as those described below.

Capacitive sensing is achieved by the headset electronics 120 measuring the capacitance of a sense plate 160, for example, by using a charge transfer technique such as that described in more detail below. The sense plate 160 is provided in the headset 100 underneath the cover 106. Hence, in this embodiment, the sense plate 160 does not contact the user when the headset is being worn, and is used to detect user presence by sensing proximity of the user rather than any physical contact of the user with the sense plate 160. This makes the headset 100 as comfortable as a conventional headset that does not incorporate a power management function, and also enables a conventional headset design to be used since the cover 106 does not need to be cut or otherwise further modified to accommodate a touch sensor.

Figure 2:
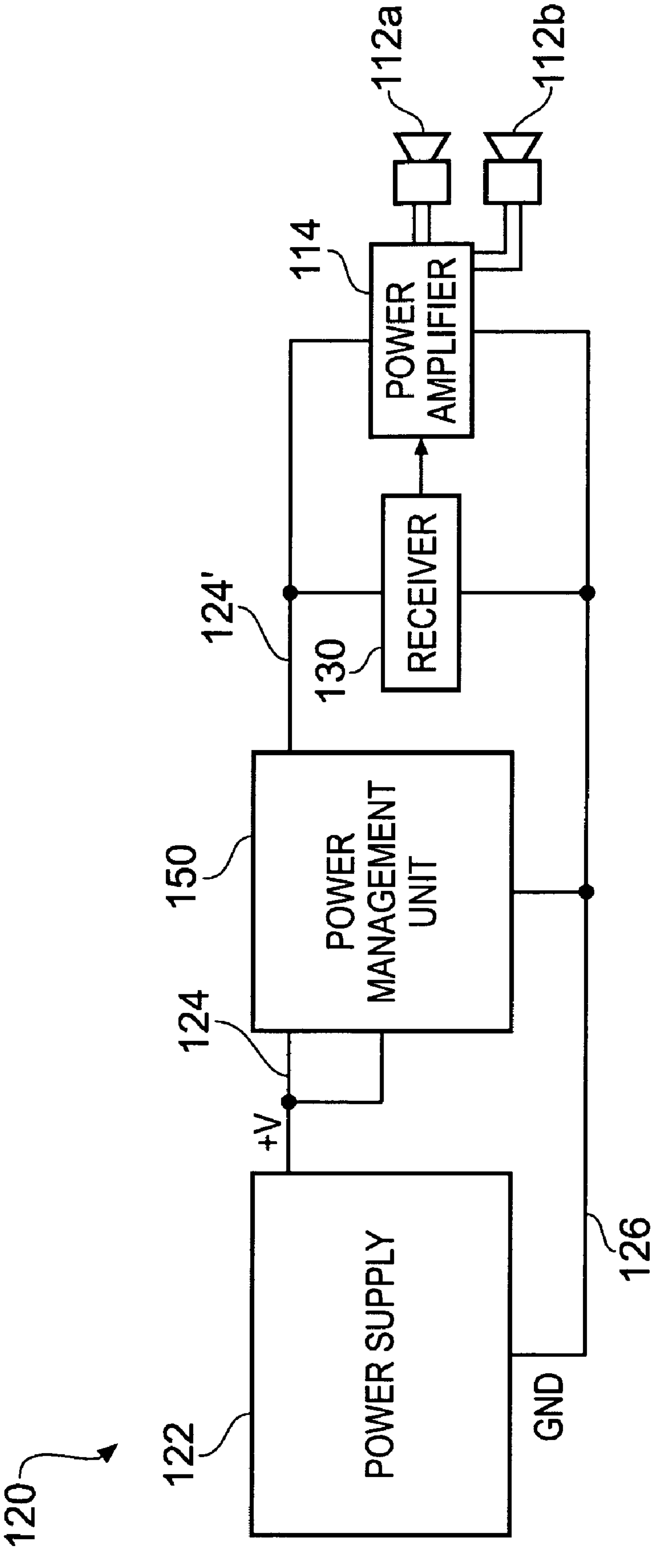
FIG. 2 shows a schematic diagram of headset electronics for use in various headsets made in accordance with the present invention.

FIG. 2 shows a schematic diagram of headset electronics 120 for use in various embodiments of headsets made in accordance with the present invention. The headset electronics 120 includes a power supply 122 for powering a radio frequency (RF) receiver 130 that receives and decodes signals that are transmitted to the headset 100. The headset electronics 120 also includes a power amplifier 114 which amplifies audio signals that are decoded by the receiver 130, amplifies the audio signals and feeds the amplified audio signals to respective loudspeakers 112*a* and 112*b* for stereo sound reproduction. The receiver 130 may be a conventional Bluetooth™ receiver, or other wireless receiver such as Zigbee™. Reference to wireless includes the possible use of an infrared link or radio link.

The power supply 122 can include a rechargeable battery plus associated charging and a power conditioning circuit. In alternative embodiments, the headset 100 can be powered by conventional batteries or from an external power source. However, in the embodiment of FIG. 2, use of a rechargeable battery conveniently allows for cordless operation of the headset 100.

A positive output of the power supply 122 is electrically coupled to a positive supply rail 124. The negative or ground output of the power supply 122 is electrically coupled to a negative supply rail 126. The electronic components that form the headset electronics 120 are electrically coupled to the negative supply rail 126. In addition, a power management unit 150 is provided that is operable to electrically connect the positive supply rail 124 to a disconnectable portion of the positive supply rail 124'. Operation of the power management unit 150 to disconnect the portion of the positive supply rail 124' from the positive supply rail 124 cuts off the power supply to any electronic components that are powered from the portion of the positive supply rail 124', thereby reducing the total power that is consumed by the headset electronics 120 when the power management unit 150 is in a disconnect state.

When the power management unit 150 is in the disconnect state, only the power management unit 150 itself need draw any power from the power supply 122. In variants of this embodiment, any electronic components that need to be permanently in an active state are electrically connected between the positive supply rail 124 and the negative supply rail 126, while any electronic components that can be switched off when the headset 100 is not being worn are electrically connected between the portion of the positive supply rail 124' and the negative supply rail 126.

Figure 3:
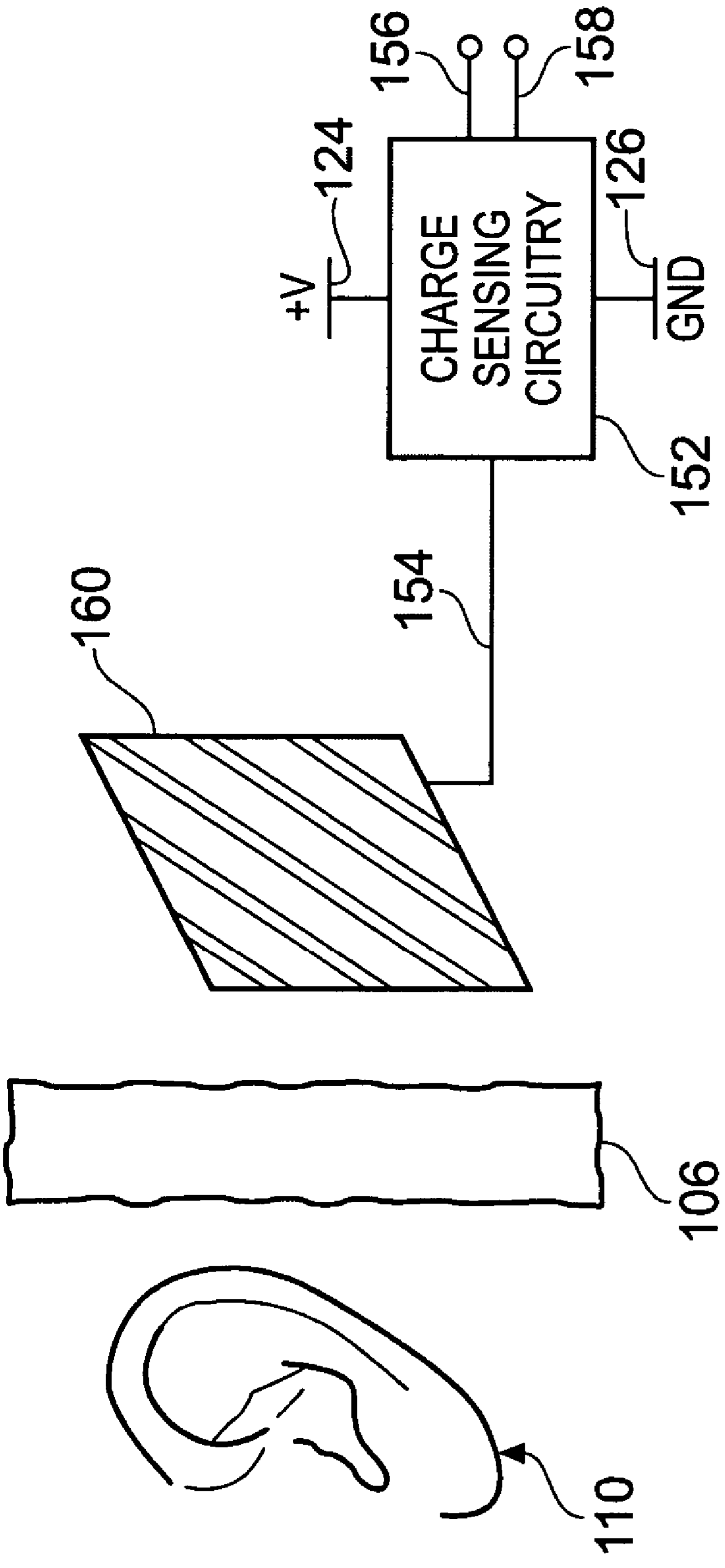
FIG. 3 shows a schematic diagram illustrating the physical configuration of various components for use in various headsets made in accordance with the present invention.

FIG. 3 shows a schematic diagram illustrating the physical configuration of various components that form part of the headset 100 shown in FIG. 1.

A portion of the cover 106 is shown in proximity to the ear of a user 110. The cover 106 separates the user 110 from the sense plate 160 that is provided in the headset 100.

Also shown, electrically coupled to the sense plate 160 by sense plate connector 154, is a charge sensing circuit 152 that forms a part of the power management unit 150. The charge sensing circuit 152 is electrically connected between the positive supply rail 124 and the negative supply rail 126 in order to draw power from the power supply 122. Two outputs, a control output 156 and a measurement output 158, are provided by the charge sensing circuit 152, these are further described below in connection with various components of the power management unit 150.

Figure 4:
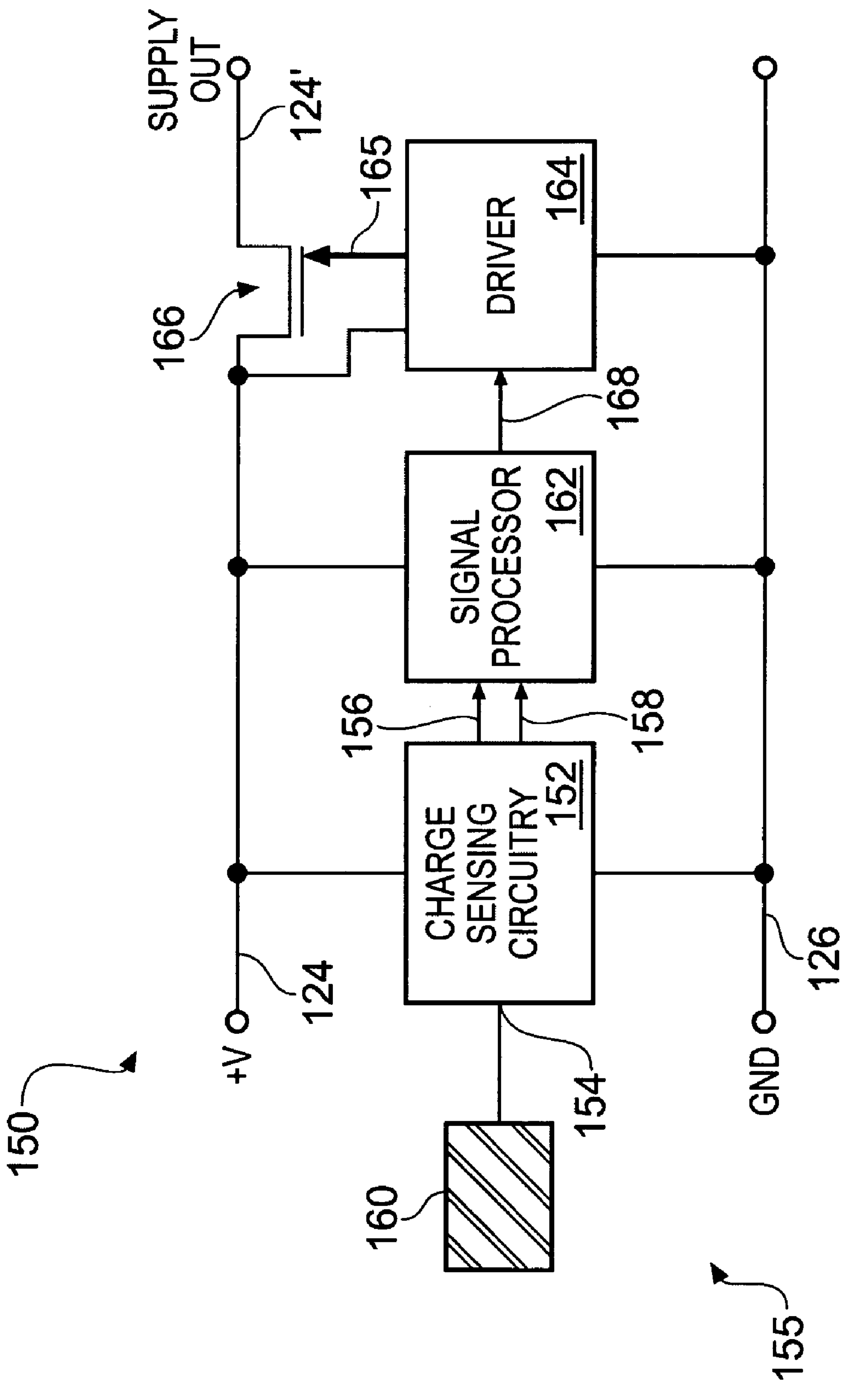
FIG. 4 shows a power management unit for use in various embodiments of the present invention.

FIG. 4 schematically shows a power management unit 150 for use in various embodiments of the present invention. The power management unit 150 comprises a charge sensing circuit 152 that is electrically coupled to a sense plate 160 by way of a sense plate connector 154.

The charge sensing circuit 152 is electrically connected between the positive supply rail 124 and the negative supply rail 126, and is operable to measure the capacitance of the sense plate 160. The charge sensing circuit 152 has two outputs 156 and 158. One of these outputs is a measurement output 158, the voltage level of which indicates the measured capacitance of the sense plate 160. The other output is a control output 156 that is used to indicate to a signal processor 162 when the voltage level of the measurement output 158 is available to be read.

The signal processor 162 is electrically connected between the positive supply rail 124 and the negative supply rail 126. It is operable to process measured capacitance values and to determine whether those measured capacitance values for the sense plate 160 indicate the presence of the user 110, a process that is described in greater detail below. The signal processor 162 provides a control output 168 whose output level indicates the presence of a user (output level=logic one) or the absence of a user (output level=logic zero).

An optional driver circuit 164 is also provided in the power management unit 150 for embodiments where the output current that can be provided by the control output 168 is not sufficient to drive field-effect transistor (FET) switch 166 directly. The FET switch 166 is operable to electrically couple the positive supply rail 124 to the portion of the positive supply rail 124' in order to activate electrical components connected to the latter supply rail 124'. Where such a driver circuit 164 is provided, it is itself powered by drawing power from between the positive supply rail 124 and the negative supply rail 126.

Optionally, the charge sense circuit 152 and the signal processor 162 may be provided together by using an integrated circuit (IC) device, such as, for example, the QT110 sensor IC available from Quantum Research Group of Hamble, Great Britain.

Figure 5:
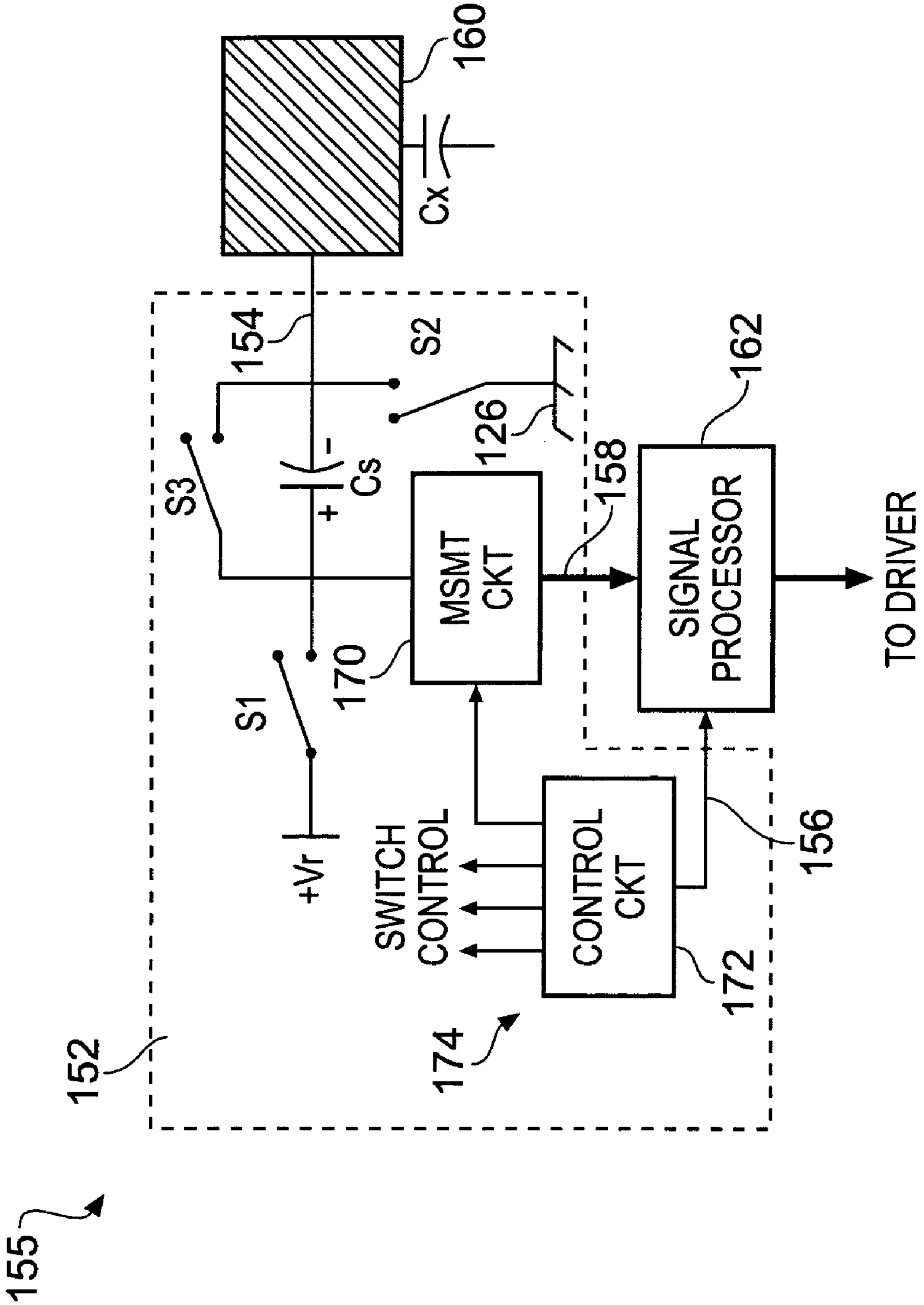
FIG. 5 shows a charge transfer capacitance measurement circuit for use in various embodiments of the present invention.

FIG. 5 shows a charge transfer capacitance measurement circuit 155. A similar charge transfer capacitance measurement circuit is described in U.S. Pat. No. 6,466,036, and the content of this document is hereby incorporated herein by reference in its entirety.

Although any suitable capacitance measurement technique may be used, the circuit of the charge transfer capacitance measurement circuit 155 is well suited for implementing on an IC. Additionally, the measuring of capacitance using a charge transfer technique can be advantageous because it provides superior performance at a lower manufacturing cost when compared to various other user presence detection techniques.

Figures 6, 7:
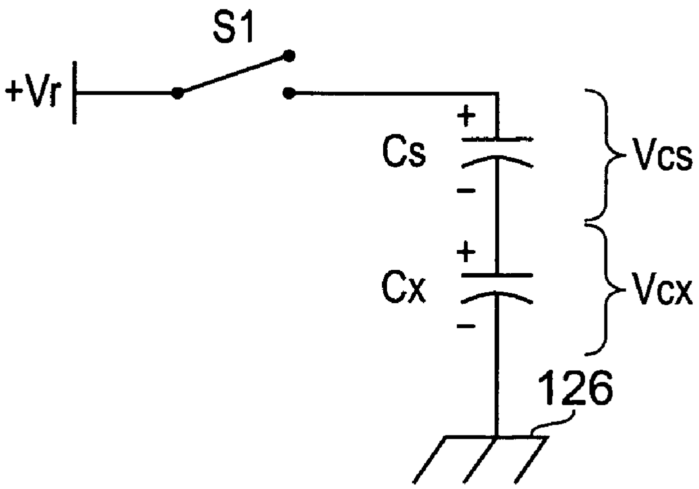
FIG. 6 shows a switching table indicating the switching sequence of the switches used in the charge transfer capacitance measurement circuit of FIG. 5.
FIG. 7 shows a schematic circuit diagram depicting an electrically equivalent rearrangement of a part of the charge transfer capacitance measurement circuit of FIG. 5.

A first switching element, S1, is used to drive electric charge through both a sampling capacitor, Cs, and a capacitance to be measured, Cx, during Step C (as summarized in the table of FIG. 6). This leaves residual charges on both Cs and Cx after S1 opens in step D of FIG. 6. Kirchoffs current law and the principle of charge conservation dictate that these charges, Qx and Qs, are equal. However, because Cs>>Cx, a greater residual voltage is found on Cx, and conversely, a lesser voltage is found on Cs. FIG. 7 reveals that the arrangement of FIG. 5 may be viewed as a capacitive voltage divider when considering the closure of S1 in step C of FIG. 6.

In FIG. 5, a sense plate 160 is explicitly depicted to indicate that in uses of the invention the presence or motion of an object that is not part of the apparatus of the invention is to be sensed by a capacitive measurement. Although the Figures sometimes show both a sense plate 160 and an unknown capacitance, Cx, it will be understood to those skilled in the art that in these depictions Cx is the capacitance of the sense plate 160 to free space or to an electrical ground. The value of Cx is modified by the presence or proximity of a user.

Again referring to the depiction of FIG. 5, a second switching element, S2, is used to clear the voltage and charge on Cx, and also to allow the measurement of Vcs, the voltage across Cs. It may be noted that the use of S2 allows S1 to be cycled repeatedly in order to build up the charge on Cs. This provides a larger measurable voltage value and greater accuracy, increasing sense gain or sensitivity without the use of active amplifiers. A third switching element, S3, acts as a reset switch and is used to reset the charge on Cs prior to beginning a charge transfer burst as explained below.

A preferred control circuit 172 controls the switching sequence and also the operation of the measurement circuit 170. The control circuit 172 is operable to switch the switches S1, S2 and S3 using the schematically-illustrated control lines 174. A signal processor, indicated as block 162, may be required to translate an output of the measurement circuit into a usable form. For example, this may involve converting cycle counts to a binary representation of signal strength. The signal processor 162 may also contain linear signal processing elements such as filters and/or non-linear functions such as threshold comparisons, so as to provide an output suitable for an intended application.

Although the control circuit 172 and signal processor 162 are depicted only schematically in FIG. 5, it will be clear to those skilled in the art that such circuit elements may also be used with circuit elements depicted elsewhere (e.g. as indicated by the bold output arrow from the measurement circuit 170), and that various circuit elements and connections have been omitted only in the interest of clarity of presentation.

The table of FIG. 6 shows the switching sequence used in one implementation using the circuit of FIG. 5. First, in step A, switching elements S2 and S3 are closed to clear charge on Cs and Cx. After a suitable pause in step B during which all switches are held open, S1 is closed to drive charge through Cs and Cx (Step C). The resulting first voltage increment across Cs is defined by the capacitive divider equation:

$$\Delta Vcs(1)=V_r Cx/(Cs+Cx) \quad (1)$$

where $V_r$ is the reference voltage connected to S1.

In step D, all switches are held open.

In Step E, S2 is closed, and ΔVcs appears as a ground-referenced signal on the positive, distal, terminal of Cs. Dead-time steps B and D are employed to prevent switch cross-conduction, which would degrade the charge build-up on Cs. The dead-time can be quite short, measuring a few nanoseconds, or longer if desired. Steps B through E may be repeated in a looping manner, to provide a “burst” of charge transfer cycles. After a suitable charge transfer burst length, the charge transfer cycle is terminated and Vcs is measured in the aforementioned manner, e.g. by using an analogue-to-digital converter (ADC), in Step F, with S2 closed and the other switches open. Following the measurement of Vcs, S3 may also be closed to reset Cs in preparation for the next charge transfer burst, during which a further plurality of packets of charge will be transferred from Cx to Cs.

In an alternative variant, steps E and F may be combined so that a measurement is made at each charge transfer cycle. By combining steps E and F, which are functionally identical, the measurement circuit 170 can be made to consist of a simple voltage comparator with a fixed reference. In such cases, the looping action of the charge transfer cycles is terminated when the voltage comparison indicates that Vcs has risen above a selected threshold value. The number of cycles taken to reach this point becomes the signal reading which is indicative of the value of the capacitance Cx. This technique is explained further below.

During the repeating loop of steps B through E, voltage builds up on Cs but not on Cx. Cx is continuously being discharged in step E, and hence Cx cannot build up an increasing amount of charge. However, Cs freely accumulates charge, so that the resulting incremental voltage is dependent on the difference in the voltages $V_r$ and Vcs as follows:

$$\Delta Vcs(n)=K(V_r-Vcs(n-1)) \quad (2)$$

where $V_r$ is a supply voltage that may be a fixed reference voltage; n is the charge transfer cycle number; and K=Cx/(Cs+Cx).

The final voltage across Vcs is equal to the sum of the initial value of Vcs plus Vcs(N) which is equal to the sum of all of the subsequent values of ΔVcs. That is:

$$Vcs(N)=\Delta Vcs(1)+\Delta Vcs(2)+\Delta Vcs(3)+\ldots+\Delta Vcs(N) \quad (3)$$

or, $$Vcs(N)=\Sigma\Delta Vcs(n)=K\Sigma(\Delta V_r-Vcs(n-1)) \quad (4)$$

where the summation runs over the range from n=1 to n=N.

Figure 8:
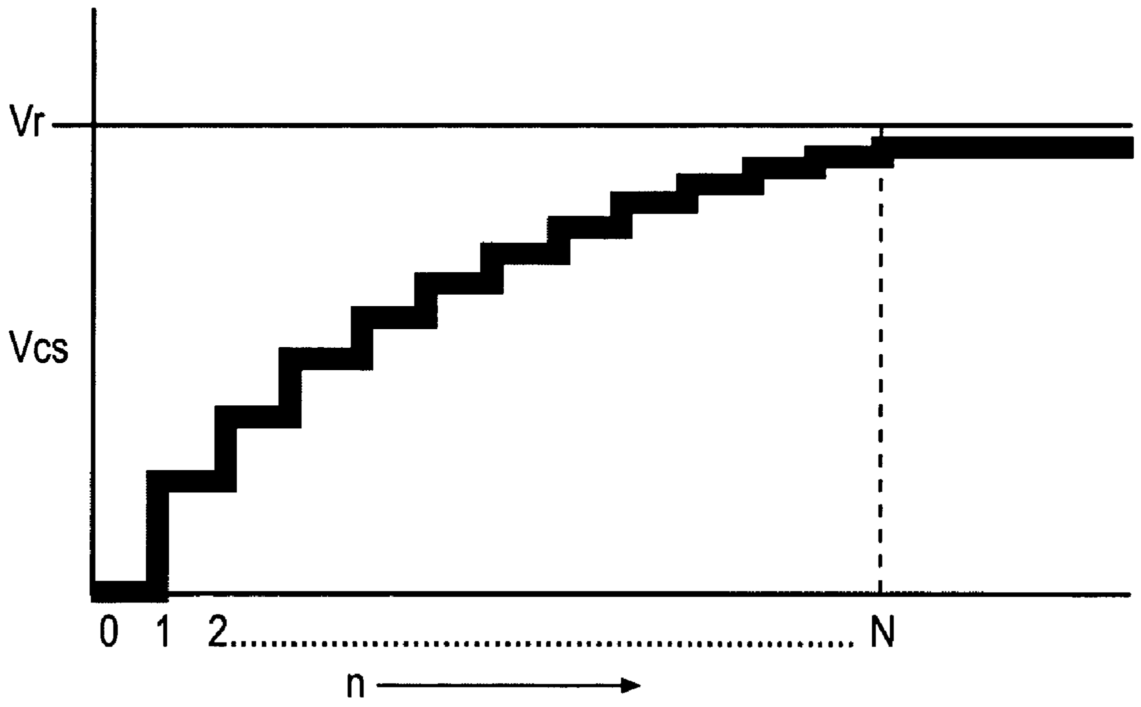
FIG. 8 shows a plot of voltage across capacitor Cs of the charge transfer capacitance measurement circuit of FIG. 5 as a function of cycle number during a burst-mode operation.

During each charge transfer cycle, the additional incremental voltage on Vcs is less than the increment from the prior cycle and the voltage build-up can be described as a limiting exponential function:

$$V(N)=V_r-V_re^{-dn} \quad (5)$$

where d is a time scaling factor. This produces the profile that is shown in FIG. 8.

In practice, a burst is terminated well before Vcs rises to be approximately the same as $V_r$. In fact, if the rise in Vcs is limited to <10% of $V_r$, the linearity can be made acceptable for most applications. For simple limit sensing applications, Vcs can be permitted to rise higher, at the expense of increasingly degraded signal-to-noise ratios in the threshold comparison function.

The charge transfer burst can be terminated after a fixed or after a variable number of cycles. If a fixed number is used, the measurement circuit 170 should be capable of representing continuous signals much as in the fashion of an ADC or an analogue amplifier. If a variable burst length is used, a simple comparator with a fixed reference can be employed for the measurement circuit 170, and the length of the burst required is that at which Vcs has built up to a level where it equals the comparison voltage. The burst can continue beyond the required number, but the extra charge transfer cycles are superfluous. A count of the charge transfer cycles required to achieve the comparison voltage is the output result, and for all practical purposes is indistinguishable from an ADC result. Such a result may be obtained by repeating the switching sequence of FIG. 6, including a number of loop cycles, in order to periodically check for the presence of a user (e.g. once per second).

Note that in FIG. 5 the measurement circuit 170 is connected to the (+), distal, side of Cs, and the reading is taken when S2 is closed. Although the (+) side of Cs is the most convenient measurement point for a ground-referenced signal, it is also possible to measure Vcs on the (−), proximal, side of Cs by holding S1 closed instead of S2. The reading is then $V_r$-referenced instead of ground referenced, which those skilled in the art will recognise as being generally inferior but still possible. In either case, the measurement being made is the de facto value of Vcs. Whether the reading is made with respect to ground or $V_r$ is irrelevant to the invention, what is important is the differential voltage across Cs.

Although FIG. 5 describes the use of a measurement circuit 170, those skilled in the art will realise that this is only one way of putting the invention into effect and that use of such a measurement circuit is not essential in order to implement alternative embodiments of the invention.

Various optional improvements can be made to the charge transfer capacitance measurement circuit 155 by incorporating additional post-acquisition algorithms into the processing capability of the signal processor 162. Examples are:

1. A drift compensation mode, in which the circuit 155 can continuously adjust its threshold in accordance with slow changes that affect signal strength. These changes may include temperature fluctuations, moisture build-up, or mechanical creep, etc. This can be accomplished by altering one or more reference level slowly at a slew-rate limited rate when no detection is being sensed.

2. Incorporation of hysteresis, in which in order to prevent 'contact bounce' the circuit 155 can incorporate detection threshold hysteresis so that the initiation detection level is different, i.e. higher, than the non-detection level, thus requiring the signal to transit though a lower signal level than the threshold level before a 'no detect' state is entered.

3. Incorporation of a consensus filtering function into the charge transfer capacitance measurement circuit 155. This feature can be provided by one or more comparators acting to compare the measured capacitance value to a predetermined threshold value. It can also be provided by the signal processor 162 sequentially comparing the measured capacitance value to a threshold value multiple times. A poll of the results is obtained and the consensus as to whether the measured capacitance value is above or below the threshold value is accepted as the final result. This feature reduces the amount of false triggering of the charge transfer capacitance measurement circuit 155 when detecting the presence or absence of a user, and consequently improves the reliability of the power management unit 150.

The above numbered optional features may be provided by various algorithms encoded in the signal processor, for example. They are also useful in various combinations and degrees in conjunction with various of the circuits described herein, to provide a more robust sensing solution that can adapt to a variety of real-world sensing challenges, such as dirt accumulation, the presence of moisture, thermal drift, etc.

Figure 9:
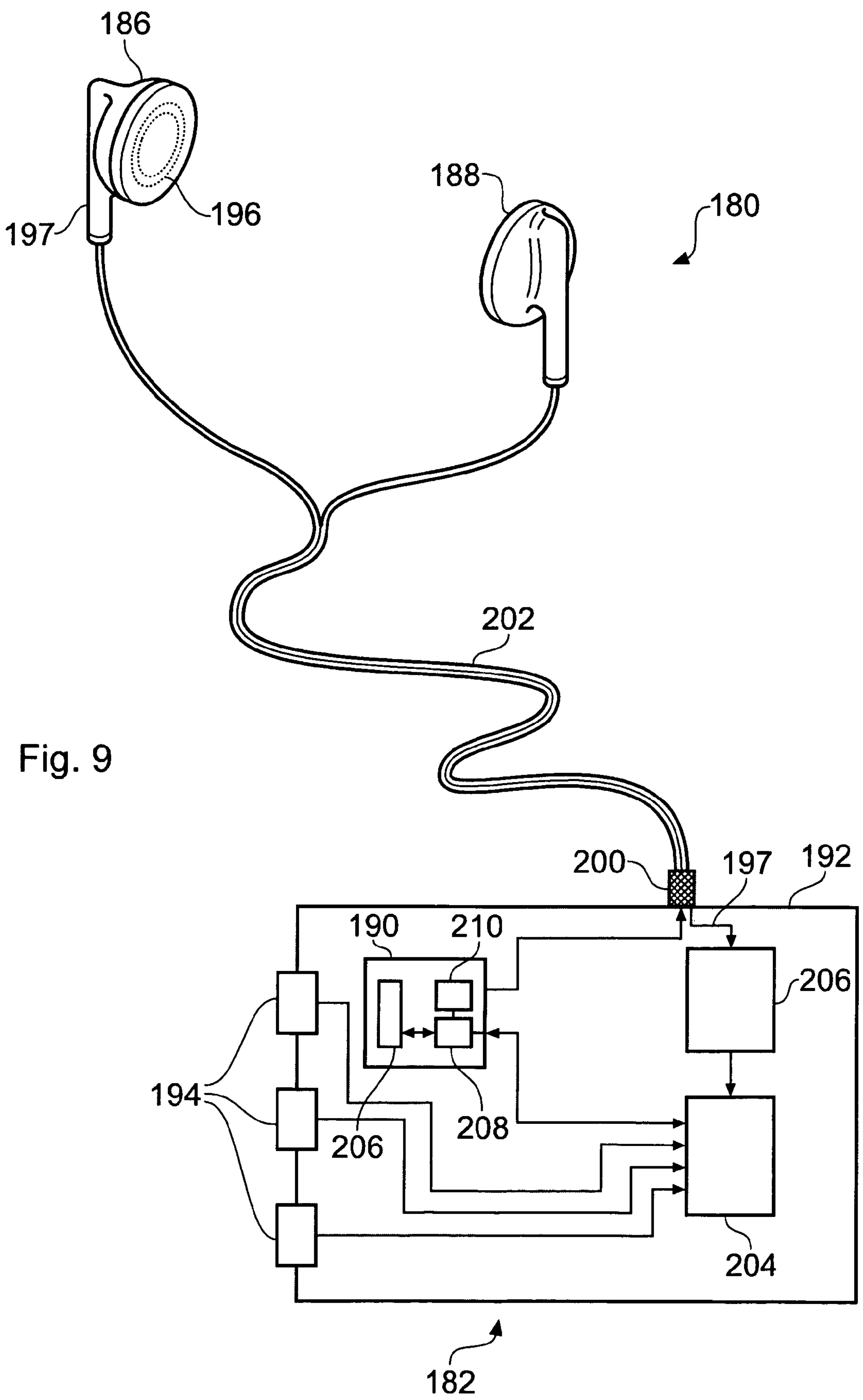
FIG. 9 shows a schematic diagram of an apparatus according to another embodiment of the invention.

FIG. 9 schematically shows an apparatus according to another embodiment of the invention. The apparatus is a portable music player and comprises a headset 180 which includes a flexible lead 202 which allows it to be connected to a base unit 182. The apparatus is configured so that playback of an audio signal is automatically paused when a user removes the headset and automatically restarted when a user re-dons the headset.

The headset in this example is a stereo headset and comprises two audio speakers (not shown) located within respective first 186 and second 188 ear-piece housings. The ear-piece housings 186, 188 are designed to be worn in a user's ear so that the user can hear audio from the speakers. Within the first ear-piece housing 186 is a sensing element in the form of an electrically conducting sense plate 196. The sense plate in this example is a metal ring located adjacent an internal surface of the ear-piece housing 186. The audio speakers in the ear-piece housings are connected to the base unit 182 via wiring within flexible lead 202 and removable jack plug 200 using generally conventional techniques. However, the flexible lead 202 and jack plug 200 are also configured to establish an electrical connection between the sense plate 160 and the base unit 182 via sense plate connector wire 197.

The base unit 182 comprises a housing 192, user accessible control buttons 194 for allowing a user to provide inputs to govern aspects of the operation of the apparatus, control circuitry (also referred to as controller) 204, capacitance measurement circuitry 206 and an audio signal generator 190. In this case the base unit 182 is a hard-disk based audio player and the audio generator 190 comprises a hard-disk 206 for storing audio files and associated drive and read circuitry 208 and amplifier circuitry 210. The amplifier circuitry supplies signals to the speakers in the ear-piece housings via the wiring in the jack plug 200 and flexible lead 202 to allow the audio files to be played to a user.

In use, a user inserts the ear-pieces 186, 188 of the headset 180 into his respective ears and, using the control buttons 194, instructs the base unit 182 to play a desired audio track to be supplied to the speakers in the ear-pieces. This is achieved in a substantially conventional manner. I.e., the control circuitry 204 responds to inputs from the control buttons to configure the hard-disk drive 206 and read circuitry 208 appropriately to play back the desired audio track through the amplifier circuitry 210, to the speakers via jack plug 200 and flexible lead 202.

The sense plate 196 is connected to the capacitance measurement circuit via sense plate connector wire 197. During operation, the capacitance measurement circuitry monitors the capacitance of the sense plate 196, e.g. to a system ground or other reference potential. This can be done using any known capacitance measurement technique. For example, the capacitance measurement circuitry 206 could be based on charge transfer (as described above), measuring the time constant of an RC circuit including the sense plate, or another techniques, such as those based on relaxation oscillators, phase shift measurements, phase locked loop circuitry, capacitive divider circuitry, and so on, as are known in the art. The capacitance measurement circuitry may be configured to continually monitor the capacitance of the sense plate 196, or to take readings less often, for example once every five seconds or so.

The capacitance measurement circuitry 206 is configured to supply a capacitance measurement signal representing the measured capacitance to the control circuitry 204. On receipt of the capacitance measurement signal, the control circuitry compares it with a stored threshold level $C_{th}$ which relates to the capacitance of the sense plate as measured when the headset is not being worn. If the measured capacitance is less than the threshold level it is assumed that the headset is not being worn. If, on the other hand, the measured capacitance is greater than the threshold level, it is assumed that the head set is being worn on the basis that, as described above, the presence of the user has increased the measured capacitance of the sense plate. Thus the threshold corresponds to the capacitance of the sense plate as measured when the headset is not being worn plus a margin to account for noise and variations in measured capacitance not associated with the presence of a user. If an average measured capacitance of $C_{no}$ is expected when the headset is not being worn, and an average measured capacitance of $C_{yes}$ is expected when the headset is being worn, the threshold may, for example, be set midway between $C_{no}$ and $C_{yes}$.

Thus depending on whether the measured capacitance exceeds the threshold level, the controller can determine whether or not the headset is being worn and activate or disable functions of the apparatus as appropriate (i.e. in accordance with how it has been programmed to operate). In this case, if the measured capacitance is less than the threshold level $C_{th}$ so that it is determined the headset is not being worn, the controller instructs the drive and read circuitry in the audio generator to pause playback.

The operation of the apparatus may be controlled in stages depending on the duration over which the capacitance is measured to be less than the threshold. For example, during the initial pause in playback, the apparatus may continue to be fully powered, with the hard disk continuing to spin, and so on. However, if after a given period of time, for example, 30 seconds, the measured capacitance is still less than the threshold level $C_{th}$, the control circuitry may instruct the read and drive circuitry to stop the hard-disk from spinning, e.g., to reduce wear. If after another period of time, for example, another 30 seconds, the measured capacitance remains less than the threshold level $C_{th}$, the control circuitry may then instruct the read and drive circuitry and the power amplifier to enter a power saving mode. After yet a further period of time, for example a further minute or two, if the measured capacitance still remains less than the threshold level $C_{th}$, the controller may be configured to fully power down the apparatus on the assumption that the user has permanently stopped listening to it.

If at any stage the measured capacitance rises above the threshold level $C_{th}$, the controller determines that a user has re-donned the headset, and playback continues from the point at which it was initially paused. Thus the user is provided with continued playback of an audio track without requiring him to control the apparatus himself.

For ease of explanation, the control circuitry 204, the capacitance measurement circuitry 206 and the drive and read and amplifier circuitry in the audio generator 190 are shown as discrete elements in FIG. 9. However, it will be understood that the functionality of some or all of these circuit elements could be provided by a single integrated circuit. For example, an application specific integrated circuit (ASIC), or a suitably programmed micro-processor could be used. Thus, the division of the above described circuitry functions among integrated circuit components is not significant. For example, the comparison between an analogue representation of the measured capacitance and a threshold level may occur within the capacitance measurement circuitry, with the capacitance measurement circuitry then supplying a binary signal to the control circuitry to indicate whether or not the capacitance exceeds a threshold.

Furthermore, it will be appreciated that rather than rely on a threshold level based on an absolute measure of capacitance, the control circuitry may be configured to determine when a user puts on or removes the headset based on changes in measured capacitance. This has the advantage of accommodating drifts in the measurement, e.g. associated with changes in environmental conditions. For example a significant increase in measured capacitance from one measurement to the next (or occurring over a given time period such as a few seconds, depending on the rate at which measurements are made) would be associated with a user putting on the headset. Conversely, a significant decrease in measured capacitance from one measurement to the next (or over a given time period) would be associated with a user removing the headset. A significant increase/decrease might be deemed to be a change of 50% or more of the expected difference in measured capacitance between the headset being worn and not worn, for example.

It will also be appreciated that the same techniques can be applied to many other apparatuses. For example, rather than the base unit being a hard-disk based audio player, the apparatus might be a CD player, an audio cassette player, a radio, a DVD player, a mobile telephone, a solid state based audio player, or any other apparatus that may be associated with providing an audio signal to a headset.

Furthermore, in some embodiments the headset itself may include all of the necessary circuitry such that no separate base unit is required. This is likely to be impractical for some apparatuses, for example CD players, but may be useful for other devices, such as solid state music players, mobile phone headsets and so on. In some cases, a base unit may be used, but aspects of the above described circuitry nonetheless be located in the headset. For example, the capacitance measurement circuitry may be located in the headset if there is a concern that the lead to the sense plate would cause too much pick-up for reliable capacitance measurement.

What is more, in addition to (or instead of) pausing the playback, the invention can be used to control many other functions of an apparatus. For example, the control circuitry may be configured to automatically route audio signals to an external amplifier driving conventional (i.e. not headset) box speakers when the headset is removed. In another example, the control circuitry may be configured to inhibit response to user inputs depending on whether the headset is being worn. For example, if the headset is not being worn, a button for switching on the apparatus may be inhibited to prevent accidental activation when in a user's pocket or bag. Alternatively, some control buttons, e.g. an increase volume button, may be inhibited when the headset is being worn to prevent accidentally increasing volume to an uncomfortable level.

The headset need not be stereo, but could be monaural. Where it is stereo, sense plates could be incorporated in the headset in association with both of a user's ears, if desired. This could allow an apparatus to respond to one or other (or both) ear-piece housings from being removed from a user's head. For example, the apparatus might pause if any one ear-piece is removed, or only if both are removed. Furthermore, the function to be controlled could depend on which ear-piece (speaker housing) is removed. For example, if a left-ear ear-piece is removed, the audio signal to the speaker in that ear-piece could be stopped while the other was maintained.

It will be understood that the communication (both of audio signals and capacitance measurement related signals) between the headset and the base unit (in embodiments where there is one) could be established wirelessly rather than through a flexible lead and jack plug as shown in FIG. 9. For example, any of the communications protocols described above could be used.

While the invention is susceptible to various modifications and alternative forms, specific embodiments are shown by way of example in the drawings and are herein described in detail. Accordingly, the skilled man will be aware that many different embodiments of the invention are possible. It should thus be understood that the drawings and corresponding detailed description are not intended to limit the invention to the particular form disclosed, but on the contrary, the invention is to cover all modifications, equivalents and alternatives falling within the spirit and scope of the present invention as defined by the appended claims.

For example, the skilled man would be aware that capacitive sensing may entail use of a sensor circuit for measuring the absolute or relative capacitance of a two-leaded capacitor or of a free-space sense plate, and for providing as an output, a measurement of the capacitance in any usable form. For example, a device only capable of generating a single-bit thresholded "detect" output would still be considered a sensor circuit for the purposes of this disclosure.

The skilled man would also be aware that a capacitive sensor may be located remotely from a headset. For example, a capacitive sensor may be provided on an electronic device, such as a mobile telephone, to which the headset is operably coupled.

In addition, the skilled man would be aware that various of the switches described herein may be implemented using an electronically controlled switch, such as, for example, by way of a bipolar or field effect transistor, a relay, an opto-electronic device, or any functionally similar circuit. He would also be aware that a controller or control circuit may comprise a circuit or system capable of generating digital control signals. Such a controller or control circuit may control a capacitance measurement circuit sensor (including control of switching elements therein) and the measurement circuit, and may generate a decision output if required. Such controllers or control circuits may comprise digital logic means such as a programmable logic array or a microprocessor, for example.

Those skilled in the art will also be aware that headsets according to the present invention need not necessarily be cordless devices that incorporate receivers and transmitters, or merely receivers, whether they be Bluetooth™ enabled or otherwise. Moreover, they will also be aware that various embodiments of the invention may be wearable by a user in proximity to only a single ear, and not require the use of stereo loudspeakers.

REFERENCES

1. GB-A-1,483,829
2. U.S. Pat. No. 5,678,202
3. U.S. Pat. No. 6,356,644
4. JP2000278785 A
5. U.S. Pat. No. 6,466,036.

What is claimed is:

1. An apparatus comprising:

a capacitive sensing element in a housing of a headset; and one or more computer-readable non-transitory storage media coupled to the capacitive sensing element and embodying logic that is operable when executed to:

monitor a capacitance through the capacitive sensing element;

if the capacitance is below a stored threshold value, then:

determine an operation based on an amount of time the capacitance is below the stored threshold value; and control a function of the headset in response to the determined operation.

2. The apparatus of claim 1, wherein the capacitance being below the stored threshold value indicates that the headset is in proximity to a user.

3. The apparatus of claim 1, wherein the capacitive sensing element comprises a ring-shaped electrode.

4. The apparatus of claim 1, wherein the media is internal to the headset.

5. The apparatus of claim 1, wherein the logic is further operable to:

compare the capacitance to the stored threshold value multiple times; and determine the operation of the headset based on a poll of the multiple comparisons.

6. The apparatus of claim 1, wherein the function is provided by a circuit element that is external to the headset.

7. The apparatus of claim 1, wherein the media is external to the headset.

8. The apparatus of claim 1, wherein the function is a power-saving function.

9. The apparatus of claim 1:

further comprising an audio amplifier for supplying audio signals to speakers in the headset;

wherein the function is activation of the audio amplifier.

10. The apparatus of claim 1:

further comprising a wireless communications transceiver;

wherein the function is activation of the wireless communications transceiver.

11. The apparatus of claim 1:

further comprising an audio generator for outputting an audio signal;

wherein the function is output of the audio signal by the audio generator.

12. The apparatus of claim 1:

further comprising input buttons for supplying operating signals to circuitry of the headset enabling a user to control one or more operations of the headset;

wherein the function is inhibition of operating signals from the input buttons.

13. A method comprising:

monitoring a capacitance through a capacitive sensing element in a housing of a headset; and if the capacitance is below a stored threshold value, then:

determining an operation based on an amount of time the capacitance is below the stored threshold value; and controlling a function of the headset in response to the determined operation.

14. The method of claim 13 further comprising adjusting the stored threshold value in response to a change in operating conditions.

15. The method of claim 13 further comprising:

comparing the capacitance to the stored threshold value multiple times; and determining the operation of the headset based on a poll of the multiple comparisons.

16. The method of claim 13, wherein the function of the headset comprises activating a wireless communications transceiver.

17. The method of claim 13, wherein the function of the headset comprises activating an audio signal generator.

18. The method of claim 13, wherein the function of the headset comprises inhibiting operating signals from an input button.

19. One or more computer-readable non-transitory storage media embodying logic that is operable when executed to:

monitor a capacitance through a capacitive sensing element within a headset; and if the capacitance is below a stored threshold value, then:

determine an operation based on an amount of time the capacitance is below the stored threshold value; and control a function of the headset in response to the determined operation.

20. The media of claim 19, wherein the capacitance being below the stored threshold value indicates that the headset is in proximity to a user.

21. The media of claim 19, wherein the logic is further operable to:

compare the capacitance to the stored threshold value multiple times; and determine the operation of the headset based on a poll of the multiple comparisons.

22. The method of claim 13, wherein the capacitance being below the stored threshold value indicates that the headset is in proximity to a user.

* * * * *